United States Patent [19]

Eggermont et al.

[11] 4,039,949
[45] Aug. 2, 1977

[54] PULSE CODE MODULATION WITH DYNAMIC RANGE LIMITING

[75] Inventors: Ludwig Désiré Johan Eggermont; Karel Riemens, both of Eindhoven, Netherlands

[73] Assignee: U.S. Philips Corporation, New York, N.Y.

[21] Appl. No.: 608,390

[22] Filed: Aug. 27, 1975

[30] Foreign Application Priority Data

Sept. 10, 1974  Netherlands .......................... 7411988

[51] Int. Cl.² ........................................... H03K 13/22
[52] U.S. Cl. .................................... 325/38 B; 325/62; 333/14
[58] Field of Search .......................... 325/38 B, 62, 65; 333/14

[56] References Cited

U.S. PATENT DOCUMENTS 3,859,597  1/1975  Zwaal .................................. 325/38 B
3,903,485  9/1975  Dolby ....................................... 333/14

Primary Examiner—Benedict V. Safourek
Attorney, Agent, or Firm—Frank R. Trifari; Simon L. Cohen

[57] ABSTRACT

The invention relates to transmission systems with dynamic compansion for the coded transmission of speech signals. By the use of a limiting device in the dynamic control circuit of the receiver the intelligibility is improved. The limiting device is such that the dynamic range of a transmitted signal is limited so that no relevant information is lost in the period the human ear needs to adapt itself to rapid sound variations.

5 Claims, 3 Drawing Figures

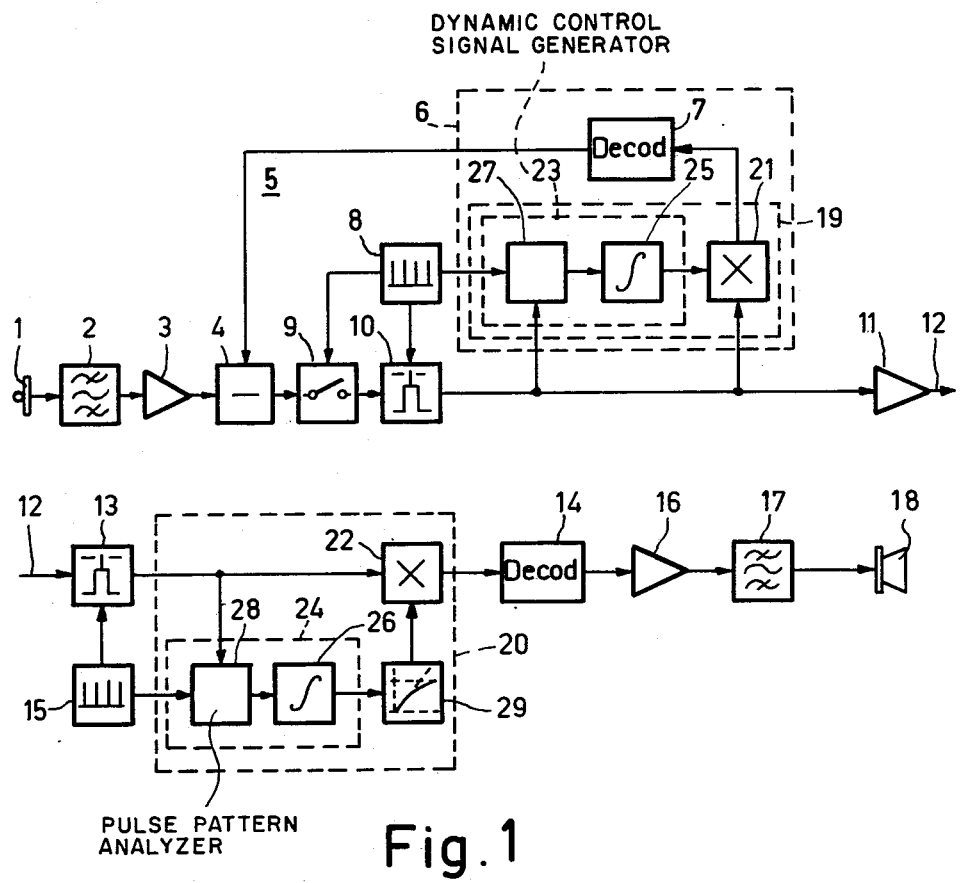
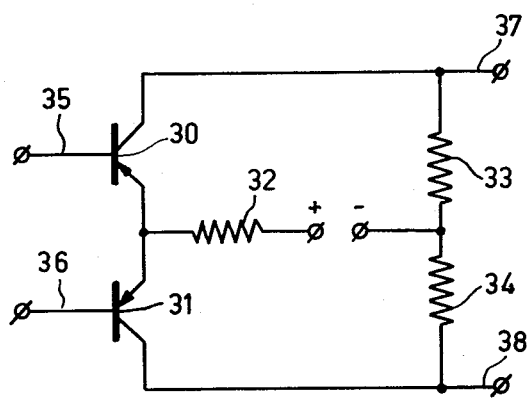
Fig.1
Fig.2

4,039,949

PULSE CODE MODULATION WITH DYNAMIC RANGE LIMITING

FIELD TO WHICH THE INVENTION RELATES

The invention relates to a pulse code modulation transmission system, the transmitter comprising a device for dynamic compression and the receiver comprising a device for dynamic expansion, which latter device consists of a dynamic control circuit comprising a dynamic control signal generator to which transmitted information pulses are supplied and a multiplier to which the dynamic control signal produced by the dynamic control signal generator is supplied together with transmitted pulses and whose output is connected to a decoding circuit for reconstructing the signal to be transmitted.

STATE OF THE ART

Pulse code modulation systems in which dynamic compression and dynamic expansion are used, are known; U.S. Pat. No. 3,518,548 for example describes a delta modulation system having two separate channels, the dynamic control signal in the transmitter being produced by sampling the envelope of the information signal. The pulses thereby produced are transmitted to the associated receiver by a first transmitter through a first channel, and there fed to a dynamic control signal generator, to generate a dynamic control signal. The pulses which have been obtained in the transmitter from the information signal and which have been transmitted to the associated receiver by a second transmitter through a second channel are modulated with the dynamic control signal in an amplitude modulator.

A transmission system of the type described above in which the information signal is characterized in that the code words are formed by means of pulse code modulation, has also been described in U.S. Pat. No. 3,560,659. In the said system the dynamic control signal is composed by using the presence or absence of the pulse of the greatest weight in the code word, whereby the instantaneous signal level of the information signal is characterized in order to vary the coding and de-coding units proportionately with this level.

U.S. Pat. No. 3,729,678 further describes a similar system, in which the delta modulation principle is used, and in which the dynamic control signal, both in the transmitter and in the associate receiver, is produced by means of a pulse pattern analyser which delivers pulses which depend for their duration on the number of equal pulses occurring in the pulse series, which form the coded representation of the signal to be transmitted.

These known systems are such that the input signal of the transmitter is followed as accurately as possible by the associated receiver over the entire dynamic range, so that also all variations in the signal level of the input signal appear at the output.

SHORT DESCRIPTION OF THE INVENTION

The human ear needs some time to adapt itself to rapid variations in sound levels. Practice has taught that the intelligibility of speech signals is less when they follow each other at a considerably different sound level, than when these signals are substantially of the same level.

The invention has for its object to provide a transmission system of the said kind in which a more constant level of loudness is obtained in a very simple manner.

The system according to the invention is characterized in that in the dynamic control circuit of the receiver a limiting device is connected in the circuit formed by the dynamic control signal generator, the multiplier and the decoding circuit.

When the measure according to the invention is applied, the variations in signal level at the receiver end are limited by limiting large signal values to a predetermined value, so that a more constant loudness level is obtained and, as said hereinbefore, the intelligibility is improved.

SHORT DESCRIPTION OF THE FIGURES

The invention is explained with reference to the Figures, in which:

FIG. 1 shows a transmission system according to the invention, consisting of a transmitter and a receiver of the delta modulation type with compansion.

FIG. 2 shows a simple embodiment of a limiter for use according to the invention.

DETAILED DESCRIPTION OF THE FIGURES

Figure 3:
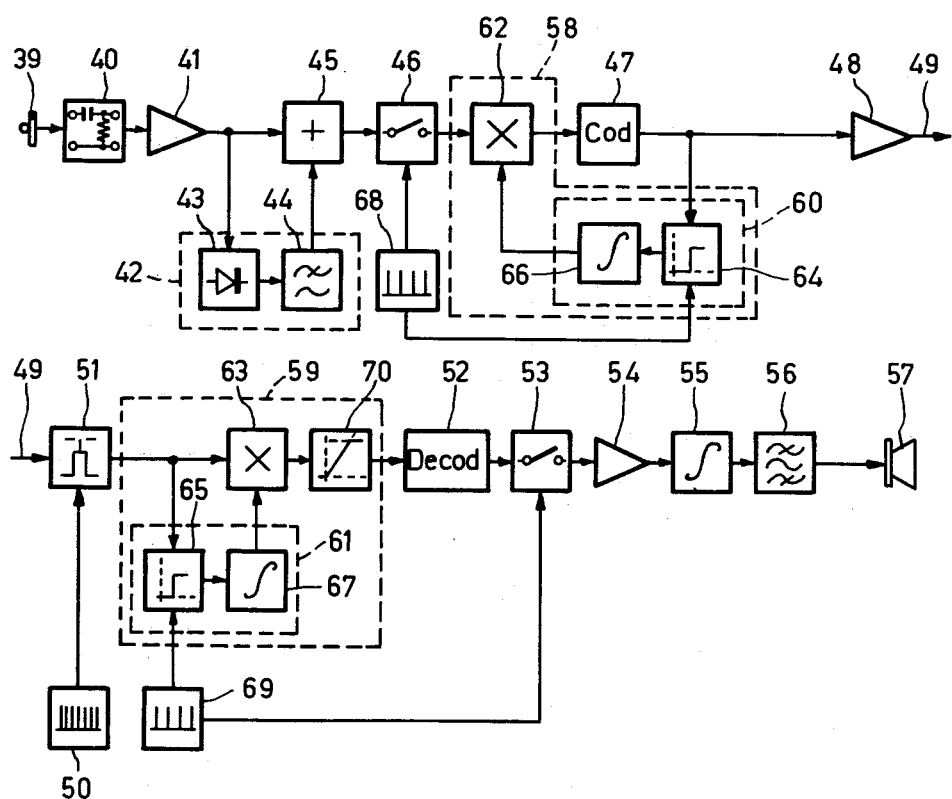
FIG. 3 shows a transmission system according to the invention in which signal transmission by means of pulse code modulation is used.

The system according to the invention as shown in FIG. 1 is suitable for the transmission of speech signals in the form of digital signals, obtained by delta modulation. Particularly, the signals derived from a microphone 1 are, in the transmitter applied to difference producer 4, via band pass filter 2 which has a pass band from 0,3 to 3,4 kHz and low-frequency amplifier 3. Via comparison circuit 5 which includes local receiver 6 and decoding circuit 7 which is incorporated therein and is shown in the embodiment as an integrating network, difference producer 4 also receives a comparison voltage. This causes a difference voltage to appear at the output of difference producer 4, which controls a sampling circuit 9 connected to a pulse generator 8.

Depending on the polarity of the output voltage of difference producer 4 pulses from pulse generator 8 either appear at the output of sampling circuit 9 or are suppressed. In known manner pulse regenerator 10 which is controlled by pulse generator 8 is connected to the output of sampling circuit 9. The regenerated pulses are fed to comparison circuit 5 and, also, after having been amplified in output amplifier 11, to an associated receiver through conductor 12.

The pulses received in the associated receiver through conductor 12 are fed via pulse regenerator 13, to a decoding circuit 14 which corresponds to decoding circuit 7 of the transmitter, whereby at the output of decoding circuit 14 a signal voltage appears which corresponds to the comparison voltage in the transmitter.

Pulse regenerator 13 is connected to local pulse generator 15 which can be synchronized in known manner with the pulse generator 8 of the transmitter. A signal voltage is fed to a reproducing device 18 via low-frequency amplifier 16 and band pass filter 17 which suppresses the frequencies which are outside the speech frequency band.

In the delta modulation system described, during the reproduction of the signals to be transmitted quantization noise due to the amplitude quantization is produced which has a disturbing effect on the quality of reproduction. As is known, this disturbing effect of the quantization noise on the quality of reproduction is reduced to a considerable extent by controlling in dynamic control circuit 19 or 20 respectively the energy content of the pulses fed to decoding circuit 7 or 14 respectively with a dynamic control signal in multiplier 21 or 22 respectively, constructed as pulse modulators. The dynamic control signal is derived from a dynamic control signal generator 23 or 24 respectively which is fed by the output pulses of sampling device 9 and has an integrating network 25 or 26 respectively, included in its output circuit.

In the embodiment shown in FIG. 1 the dynamic control signal generator 23 and 24 respectively also comprises a pulse pattern analyser 27 and 28 respectively as described in U.S. Pat. No. 3,729,678 which successively analyses the configuration of the pulse patterns formed by the output pulses, within a fixed and limited time interval of at least three consecutive pulses of pulse generator 8 or 15 respectively and which supplies, at the occurrence of predetermined pulse patterns a pulse-shaped output signal which is fed to integrating network 25 or 26 respectively for the generation of the dynamic control signal.

In practice excellent results were obtained with the system described, but as by the use of the described dynamic control circuit 19 or 20 respectively the signals supplied to microphone 1 are accurately followed all variations in the loudness level are also reproduced by the reproducing device 18.

The invention provides another conception of dynamic control circuit 20 in the receiver, resulting in a reduction of the annoying loudness variation, by including a limiter in the said dynamic control system, namely in the circuit formed by dynamic control signal generator 24, multiplier 22 and decoding circuit 14. The embodiment shown in FIG. 1 includes a limiter 29 between the output of integrating network 26 and the input of multiplier 22. Another possibility is to connect the limiter between multiplier 22 and decoding circuit 14.

FIG. 2 shows a simple embodiment of limiter 29 for use in a system according to the invention. The limiter consists of two transistors 30 and 31 and three resistors 32, 33 and 34 which are interconnected in the manner shown in the figure. As such the transistors 30 and 31 form a so-called "long-tailed pair". The bases 35 and 36 of transistors 30 and 31 form the input of the limiter, whereas the output, at which the limited voltage is produced is formed by collectors 37 and 38.

FIG. 3 shows another transmission system according to the invention, namely a system suitable for the transmission of speech signals by means of PCM-coded pulse code modulation. In a transmitter the signals picked up by microphone 39 are supplied via a differentiating network 40 and a low-frequency amplifier 41 to a level voltage generator 42, comprising a rectifier 43 and a low-pass filter 44 having a cut-off frequency of for example 100 Hz. In a combination device 45 the level voltage is combined with the speech signal to be transmitted and supplied to a coding circuit 47 via a sampling device 46. The pulses delivered by coding circuit 47 and which characterize in code groups the level of the speech signal are transmitted to an associated receiver through a conductor 49 after amplification in a low-frequency amplifier 48.

In the receiver the pulses received through conductor 49 are regenerated in known manner by means of a pulse regenerator 51, controlled by a pulse generator 50 and applied to a decoding circuit 52.

Both coding circuit 47 in the transmitter and decoding circuit 52 in the receiver are of the version as described in British Pat. No. 1,170,727, whereby, at the input of a sampling device 53 which is connected to the decoding circuit 52, a signal voltage is produced which is comparable to the voltage at the input of the sampling device 46 of the transmitter. This signal voltage is supplied to reproducing device 57 via low-frequency amplifier 54, an integrating network 55 and a band pass filter 56.

In this system also dynamic compansion is obtained by a dynamic control circuit 58 or 59 respectively. For this purpose the dynamic control circuit consists of a dynamic control signal generator 60 and 61 respectively which supplies a control signal which controls in known manner the coding and decoding unit respectively in a multiplier 62 or 63 respectively.

In this embodiment the dynamic control signal generator 60 or 61 respectively is formed by gate 64 or 65 respectively, which is normally blocked and which is released in the rhythm of the code groups during the pulse of the greatest weight, and furthermore by an integrating network 66 or 67 respectively which is connected to the output of this gate, and which has a cut-off frequency of the order of the low frequencies of the level voltage signal, for example 20 Hz, for generating the dynamic control signal.

In the transmitter the sampling device 46 and the gate 64 are controlled by a pulse generator 68 whereas a pulse generator 69 which is to be synchronized with pulse generator 68 controls gate 65 and sampling device 53.

In the system described here intelligibility can be improved in the same way as indicated in the embodiment of FIG. 1. For this purpose limiter 70 has been connected between the output of multiplier 63 and the input of decoding circuit 52 in the receiver, as shown in the embodiment of FIG. 3.

Limiting circuits in various versions are well-known from the literature. It is to be noted here, that, in experiments good results were obtained even when one diode was used as limiter, which is possible as the signal to be limited is unipolar. However, to obtain a temperature equilibrium it is recommended to use in this case two counter-connected diodes.

It is also to be noted that other methods of compansion are known, such as for example used in HIDM ("High Information Delta Modulation") which is a form of delta modulation with non-uniform quantization of the step size, where the step size is for example determined by means of a counter reading. In this case also limitation can be used in the dynamic control circuit by operating the receiver with a certain maximum value of the step size which is smaller than the maximum step size with which the transmitter operates. This can be effected by not exceeding a certain maximum value in the decoding of the counter reading or by using a counter of a limited range.

What is claimed is:

1. A pulse code modulation transmission system of the type wherein the transmitter comprises a device for dynamic compression and the receiver a device for dynamic expansion, which latter device consists of a dynamic control circuit comprising a dynamic control signal generator to which transmitted information pulses are supplied and a multiplier to which the dynamic control signal produced by the dynamic control signal generator is supplied together with transmitted pulses and whose output is connected to a decoding circuit for reconstructing the signal to be transmitted, the improvement wherein in said receiver in said dynamic control circuit also an amplitude limiting device is connected in the circuit formed by said dynamic control signal generator, multiplier and decoding circuit the amplitude limiting device being in the path of all the signals in the circuit formed by the dynamic control signal generator multiplier and decoding circuit.

2. A system as recited in claim 1, wherein said receiver is provided with a dynamic expansion device consisting of a dynamic control circuit comprising a dynamic control signal generator to which transmitted information pulses are supplied and a multiplier to which the dynamic control signal generated by the dynamic control signal generator is applied together with transmitted pulses and whose output is connected to a decoding circuit for reconstructing the signals to be transmitted, and wherein in said dynamic control circuit also an amplitude limiting device is connected in the circuit formed by the afore-mentioned dynamic control signal generator, multiplier and decoding circuit the amplitude limiting device being in the path of all the signals passing through the circuit formed by the dynamic control signal generator, multiplier and decoding circuit.

3. A system as claimed in claim 2, wherein the limiting device in the dynamic control circuit is connected between the dynamic control signal generator output and the multiplier input.

4. A pulse code modulation receiver comprising terminal means for receiving a synamically compressed pulse code modulation signal, a dynamic control signal generator connected to said terminal means and producing dynamic control signals, a multiplier connected to said dynamic control signal generator and to said terminal means for providing a further signal, a decoder connected to said multiplier for decoding said further signal, and an amplitude limiting device connected in the circuit formed by the said dynamic control signal generator, multiplier and decoder and limiting all of the signals passing through said circuit formed by the dynamic control generator, multiplier and decoder.

5. A receiver as recited in claim 4, wherein said amplitude limiting device is connected between the dynamic control signal generator output and the multiplier input.

* * * * *